(12) United States Patent
Andoh

(10) Patent No.: US 6,724,650 B2
(45) Date of Patent: Apr. 20, 2004

(54) SEMICONDUCTOR DEVICE HAVING A LOAD LESS FOUR TRANSISTOR CELL

(75) Inventor: Takeshi Andoh, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/270,483

(22) Filed: Oct. 16, 2002

(65) Prior Publication Data

US 2003/0076706 A1 Apr. 24, 2003

(30) Foreign Application Priority Data

Oct. 22, 2001 (JP) .................................... 2001-323242

(51) Int. Cl.[7] .............................................. G11C 11/00
(52) U.S. Cl. ........................................ 365/156; 365/154
(58) Field of Search ................................ 365/156, 154, 365/188, 72

(56) References Cited

U.S. PATENT DOCUMENTS

| | | | | |
|---|---|---|---|---|
| 5,377,140 A | * | 12/1994 | Usuki | ........................... 365/154 |
| 6,198,670 B1 | * | 3/2001 | Marr | ...................... 365/189.09 |
| 6,366,493 B1 | * | 4/2002 | Hsiao et al. | ................. 365/156 |
| 6,434,040 B1 | * | 8/2002 | Kim et al. | .................... 365/154 |
| 6,442,061 B1 | * | 8/2002 | Kong et al. | .................. 365/154 |

FOREIGN PATENT DOCUMENTS

| JP | 7-302847 A | 11/1995 |
|---|---|---|
| JP | 2000-124333 A | 4/2000 |
| JP | 2001-167573 A | 6/2001 |

* cited by examiner

*Primary Examiner*—Anh Phung
(74) *Attorney, Agent, or Firm*—Sughrue Mion, PLLC

(57) ABSTRACT

A unit memory cell comprises first and second field effect transistors of a first conduction type, third and fourth field effect transistors of a second conduction type, and first and second resistance elements. A gate electrode of the first transistor is connected to a second node, a gate electrode of the second transistor is connected to a first node, a series connected structure constructed by connecting a source/drain path of the third transistor and the first resistance element in series is connected between the first node and a first bit line, a series-connected structure constructed by connecting a source/drain path of the fourth transistor and the second resistance element in series is connected between the second node and a second bit line paired with the first bit line, and both gate electrodes of the third and fourth field effect transistors are connected to a word line.

12 Claims, 13 Drawing Sheets

SEMICONDUCTOR DEVICE HAVING A LOAD LESS FOUR TRANSISTOR CELL

BACKGROUND OF THE INVENTION

1. Field of the Invention

The present invention relates to a semiconductor device (including a semiconductor memory device) incorporating therein a memory cell array that has a plurality of static memory cells disposed in a row and column array, and more particularly to a semiconductor device in which a unit memory cell is constituted by a four transistor cell having transistors therein that serve as an access transistor (hereinafter, "transistor" is abbreviated as simply "Tr") and also a load element, eliminating the need for a load resistor (hereinafter, this type of cell is referred to as "a load less 4-Tr cell").

2. Description of Related Art

In a research and development of a semiconductor device having a static memory cell array therein, various load less 4-Tr cells having no load resistor and constituted by a unit cell consisting of two access Trs and two driver Trs have been proposed to reduce an area of a memory cell array or increase the number of memory cells contained in a unit area of semiconductor device. For instance, Japanese Patent Application Laid-open No. 13(2001)-167573 (hereinafter, referred to as a known example 1) discloses a static semiconductor memory device in which a unit memory cell consists of an access Tr and a driver Tr, both being an n channel field effect Tr (hereinafter, referred to as "NMOS"). Japanese Patent Application Laid-open No. 7(1995)-302847 (hereinafter, referred to as a known example 2), Japanese Patent Application Laid-open No. 12(2000)-124333 (hereinafter, referred to as a known example 3), Japanese Patent Application Laid-open No. 13(2001)-118938 and the like disclose an SRAM (Static Random Access Memory) memory cell consisting of an access Tr and a driver Tr, both being realized respectively by employing a p channel field effect Tr (hereinafter, referred to as "PMOS") and an NMOS, or a static semiconductor memory device having therein the SRAM memory cell constructed as described above.

FIG. 12 is a circuit diagram illustrating the configurations of a memory cell Ml and a memory cell M3 of a semiconductor memory device disclosed in the known example 1. Referring to FIG. 12, the memory cell M1 comprises an NMOS 1072 connected between a bit line BL1 and a node N105, and having a gate connected to a word line WL1, an NMOS 1074 connected between a bit line /BL1 and a node N106, and having a gate connected to the word line WL1, an NMOS 1076 connected between the node N105 and a ground node, and having a gate connected to the node N106, and an NMOS 1078 connected between the node N106 and the ground node, and having a gate connected to the node N105. The NMOSes 1072, 1074 are referred to as an access Tr and the NMOSes 1076, 1078 are referred to as a driver Tr.

The memory cell M3 comprises an NMOS 1082 connected between the bit line BL1 and a node N107, and having a gate connected to a word line WL2, an NMOS 1084 connected between the bit line /BL1 and a node N108, and having a gate connected to the word line WL2, an NMOS 1086 connected between the node N107 and the ground node, and having a gate connected to the node N108, and an NMOS 1088 connected between the node N108 and the ground node, and having a gate connected to the node N107.

The semiconductor memory device of the known example 1 operates as follows: the bit line BL1 and the bit line /BL1 are precharged during standby time to set the word lines WL1, WL2 at a voltage level a little bit higher than the ground level; and a current to retain data is stably supplied through the access Tr to a node included in the nodes N105 to N108 and maintaining a high level to allow a memory cell to reliably retain data. Note that when a memory cell is accessed, a word line to be selected is set to a high level and a word line unselected is set to the ground level.

FIG. 13 is a circuit diagram illustrating the configurations of an SRAM memory cell disclosed in the known example 2. Referring to FIG. 13, the SRAM memory cell comprises a pair of PMOSes 1101, 1102 as a selection Tr and a pair of NMOSes 1103, 1104 as a driver Tr whose drains and gates are cross-connected. To the PMOSes 1101, 1102 is supplied a power supply 1110 via bus Trs 1111, 1112 and bit lines 1107, 1108 that specify a Y address (column address). During standby time, a word line 1109 provided for specifying an X address (row address) and connected to the gates of the PMOSes 1101, 1102 is made to maintain an intermediate voltage level. Thus, an electric power is supplied by the power supply 1110 to a memory cell via the bus Trs 1111, 1112 and the bit lines 1107, 1108, thereby allowing the memory cell to hold data therein. A data read operation is performed as follows. First, the voltage level of a word line connected to an unselected cell is pulled up to disconnect a memory cell from a bit line. Subsequently, the gates of the bus Trs 1111, 1112 are set to a high level to stop supplying a power to the bit lines 1107, 1108. Thereafter, the word line 1109 connected to a selected cell is set to "0" V to make the PMOSes 1101, 1102 placed into a complete turn-on state, thereby reading data from the selected cell. As described above, a selection Tr is realized by employing the PMOSes 1101, 1102 and a driver Tr is realized by employing the NMOSes 1103, 1104, and during standby time, the PMOSes 1101, 1102 are made to operate as a pull-up element, thereby permitting a circuit designer to omit a pull-up element and allowing a semiconductor manufacturer to reduce process steps for the manufacture of semiconductor device to a large extent.

Additionally, FIG. 14 is a circuit diagram illustrating the configuration of a load less 4-Tr CMOS SRAM cell as a unit memory cell included in a semiconductor memory device disclosed in the known example 3. Referring to FIG. 14, the SRAM cell comprises PMOSes 1216, 1217 and NMOSes 1218, 1219. The gate, source and drain of the PMOS 1216 are connected respectively to a word line 1230, a bit line 1231 and a node 1233, and the gate, source and drain of the PMOS 1217 are connected respectively to the word line 1230, a bit line 1232 and a node 1234, and the gate, source and drain of the NMOS 1218 are connected respectively to the node 1234, the GND and the node 1233, and the gate, source and drain of the NMOS 1219 are connected respectively to the node 1233, the GND and the node 1234. The memory cell operates such that the word line 1230 becomes a high level in a standby state and a low level when the content stored in a memory cell is read therefrom or written thereinto. Furthermore in the semiconductor memory device of the known example 3, a gate length of each of the PMOSes 1216, 1217 is made larger that that of each of the NMOSes 1218, 1219. This construction of gate length suppresses an unfavorable influence of a phenomenon observed when a voltage applied to a drain makes a potential between a source and a channel lowered to thereby lower a threshold voltage, which phenomenon is called DIBL (Drain Induced Barrier Lowering), and makes a change of off-current caused by a potential difference applied between a source and a drain as small as possible, resulting in reduction of a standby current flowing through a memory cell.

A unit memory cell consisting of a load less 4-Tr cell is critically required to have an operating allowance called "static noise margin (hereinafter, referred to as "SNM") within which a memory cell is able to retain data therein over a longer period of time and operate at a further lower voltage, in addition to general electrical performances of SRAM, i.e., high speed operation, low power consumption specifically in terms of current consumption during standby time. Then, referring to FIG. 15, the SNM will briefly be explained below. For example, in a-case where a unit memory cell is configured to have PMOSes 1301, 1302 as an access Tr shown in FIG. 15A and NMOSes 1303, 1304 as a driver Tr to thereby constitute a load less 4-Tr cell, assume that the cell is divided into two inverters 1310, 1320 as shown in FIG. 15B. In such a state, a word line 1350 is set to a low level, and a gate potential Vg1 of the NMOS 1303 and a gate potential Vg2 of the NMOS 1304 are made to vary in a situation where a specific voltage Vd is applied to bit lines 1330, 1340. Under the above-described electrical conditions, the potential Vp1 of a node P1 and the potential Vp2 of a node P2 are measured, and then plotted and superimposed on the other in a graph shown in FIG. 15C, in which the potentials Vg1, Vp2 are indicated on the axis of abscissas and the potentials Vg2, Vp1 are indicated on the axis of ordinates. In this case, a maximum square C just housed within the area surrounded by a graph A corresponding to the inverter 1310 and a graph B corresponding to the inverter 1320 can be determined and then the SNM of the unit memory cell can be calculated as a voltage corresponding to the length of a side of the square C.

Regarding the above-described load less 4-Tr cell, various techniques for improving a data retention characteristic and reducing a standby current as a consumption current during standby time have been proposed. For example, in the known example 1, the low level of a word line is made a little bit higher than the ground level to pass a larger leakage current through an access Tr in a situation where the potential of a bit line is set to a high level during standby time, thereby allowing a memory cell to reliably retain high level data therein even in a case where variation in electrical performance of access Tr is generated owing to the process variation in the manufacture of semiconductor memory device.

Furthermore, also in the known example 2, the access Tr is constituted by a PMOS and a potential of a word line is set to an intermediate level during standby time to reliably retain high level data in a memory cell.

Moreover, in the known example 3, the gate length of the access Tr (PMOSes 1216, 1217) is made larger than that of the driver Tr (NMOSes 1218, 1219) to suppress an unfavorable influence of DIBL phenomenon observed in an access Tr, thereby reducing a standby current flowing through a memory cell.

In a load less 4-Tr cell consisting of an access Tr and a driver Tr realized respectively by employing PMOS and NMOS, assume that an on-current and an off-current of the access Tr are represented respectively by $I_{onp}$ and $I_{offp}$, and an on-current and an off-current of the driver Tr are represented respectively by $I_{onn}$ and $I_{offn}$. In this case, in terms of retention ability of memory cell, the ratio $I_{offp}/I_{offn}$ is preferably made larger to maintain the potential of a storage node at a high level and in terms of improvement in the SNM during a read operation, the ratio $I_{onp}/I_{onn}$ is preferably made smaller to maintain the potential of a storage node at a low level. However, in general, both a relationship between $I_{onp}$ and $I_{offp}$ and a relationship between $I_{onn}$ and $I_{offn}$ are positive, and therefore, it has been believed that optimizing an on-current and an off-current of each of an access Tr and a driver Tr is difficult because the data retention characteristic of a storage node and the SNM are in a trade-off relationship.

In consideration of the above-described problems found in the conventional techniques, the present invention has been conceived and directed to a semiconductor device incorporating therein a memory cell array constructed by disposing a plurality of unit memory cells consisting of a load less 4-Tr cell in a row and column array and achieving improved SNM while maintaining the data retention characteristic of storage node, and further, having an ability to operate at a further lower voltage.

SUMMARY OF THE INVENTION

An object of the present invention is to provide a semiconductor device incorporating therein a memory cell array formed so as to improve the SNM while maintaining the data retention characteristic of storage node and having an ability to operate at a further lower voltage.

A semiconductor device comprises a memory cell array having a plurality of unit memory cells disposed in a row and column array. In this case, the unit memory cell, includes first and second field effect transistors of a first conduction type, third and fourth field effect transistors of a second conduction type, and first and second resistance elements. The unit memory cell is further constructed such that a source/drain path of the first field effect transistor is connected between a first power supply and a first node, a source/drain path of the second field effect transistor is connected between the first power supply and a second node, a gate electrode of the first field effect transistor is connected to the second node, a gate electrode of the second field effect transistor is connected to the first node, a series-connected structure constructed by connecting a source/drain path of the third field effect transistor and the first resistance element in series is connected between the first node and a first bit line, a series-connected structure constructed by connecting a source/drain path of the fourth field effect transistor and the second resistance element in series is connected between the second node and a second bit line paired with the first bit line, and both gate electrodes of the third and fourth field effect transistors are connected to a word line, thereby constituting a four transistor cell without a need for a load resistor.

BRIEF DESCRIPTION OF THE DRAWINGS

FIG. 1 is a diagram illustrating a semiconductor device of an embodiment of the present invention and FIG. 1A is a schematic block diagram of the semiconductor device of the present invention.

DETAILED DESCRIPTION OF THE PREFERRED EMBODIMENTS

Preferred embodiments of the present invention will be explained with reference to the accompanying drawings.

Figure 1A:
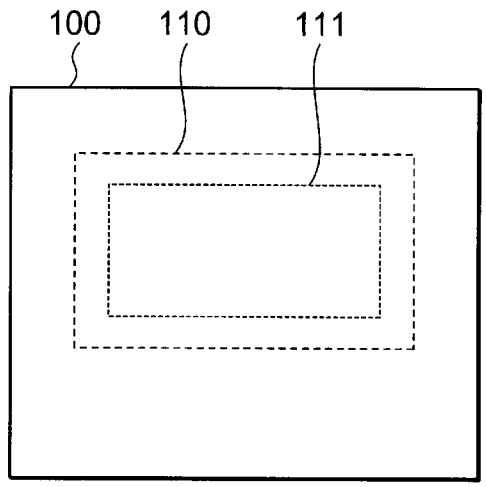
Figure 1B:
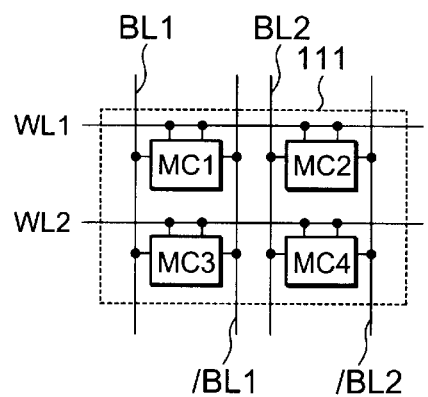
FIG. 1B is a general and schematic block diagram of a memory cell array incorporated within the semiconductor device.
Figure 1C:
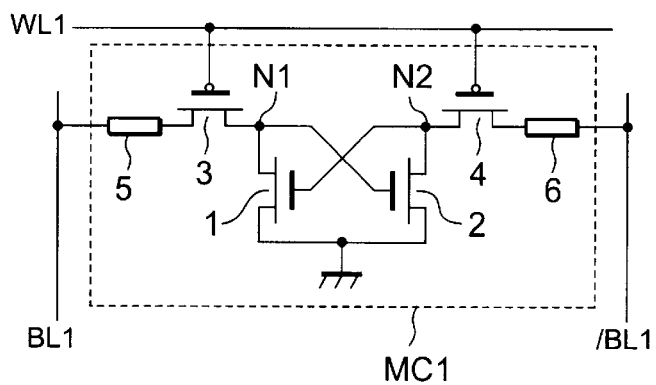
FIG. 1C is a circuit diagram of an exemplified unit memory cell constituting the memory cell array.

FIG. 1 is a diagram illustrating a semiconductor device of an embodiment of the present invention and FIG. 1A is a schematic block diagram of the semiconductor device of the present invention, and FIG. 1B is a general and schematic block diagram of a memory cell array incorporated within the semiconductor device, and further, FIG. 1C is a circuit diagram of an exemplified unit memory cell constituting the memory cell array. As can be seen from FIG. 1, a semiconductor device 100 of the embodiment comprises a memory block 110 including a memory cell array 111, an address decoder, not shown, a write control circuit, a read control circuit and the like. The memory cell array 111 includes four unit memory cells MC1 to MC4 disposed, for example, in two rows and two columns. Since all the unit memory cells MC1 to MC4 have the same circuit configuration, the memory cell MC1 will be explained as a representative memory cell below. Note that the memory cell array 111 is not limited to the above-described geometric configuration and therefore, when assuming j and k each represent positive integer, may be disposed in j rows and k columns.

The unit memory cell MC1 comprises NMOSes 1, 2 as first and second field effect Trs, PMOSes 3, 4 as third and fourth field effect Trs, and resistors 5, 6 as first and second resistance elements. The source/drain path of the NMOS 1 is connected between the ground level (hereinafter, referred to as the GND) as a first power supply and a first node N1, the source/drain path of the NMOS 2 is connected between the GND and a second node N2, the gate electrode of the NMOS 1 is connected to the second node N2, the gate electrode of the NMOS 2 is connected to the first node N1, a series-connected structure consisting of the source/drain path of the PMOS 1 and the resistor 5 is connected between the first node N1 and a first bit line BL1, a series-connected structure consisting of the source/drain path of the PMOS 4 and the resistor 6 is connected between the second node N2 and a second bit line /BL1 paired with the first bit line BL1, and both the gate electrodes of the PMOSes 3, 4 are connected to a word line WL1. Note that in more detail, the series-connected structure consisting of the source/drain path of the PMOS 3 and the resistor 5 is constructed such that one end of the resistor 5 is connected to the first bit line BL1 and the source/drain path of the PMOS 3 is connected between the other end of the resistor 5 and the first node N1. Likewise, the series-connected structure consisting of the source/drain path of the PMOS 4 and the resistor 6 is constructed such that one end of the resistor 6 is connected to the second bit line /BL1 and the source/drain path of the PMOS 4 is connected between the other end of the resistor 6 and the second node N2. In this case, assuming the resistance values of the resistors 5, 6 are respectively R5, R6 and the on-resistance values of the PMOSes 3, 4 are respectively $R_{onp3}$, $R_{onp4}$, R5, R6 and a desired access speed are in a trade-off relationship, and normally and preferably, R5, R6 are set to satisfy the relationships represented respectively by $0.1 \times R_{onp3} < R5 < 2 \times R_{onp3}$ and $0.1 \times R_{onp4} < R6 < 2 \times R_{onp4}$.

Constructing the resistors R5, R6 and the PMOSes 3, 4 as described above makes it possible to control a current flowing through each of the PMOSes 3, 4 so that the on-current flowing therethrough decreases even when an off-current flowing therethrough is made to increase to a desired value. Note that the off-current is set such that when assuming the off-currents of the NMOSes 1, 2 are respectively $I_{offn1}$, $I_{offn2}$ and the off-currents of the NMOSes 3, 4 are respectively $I_{offp3}$, $I_{offp4}$, those off-currents normally are set to satisfy the relationships represented by $I_{offp3}/I_{offn1}>10$ and $I_{offp4}/I_{offn2}>10$.

Figure 2A:
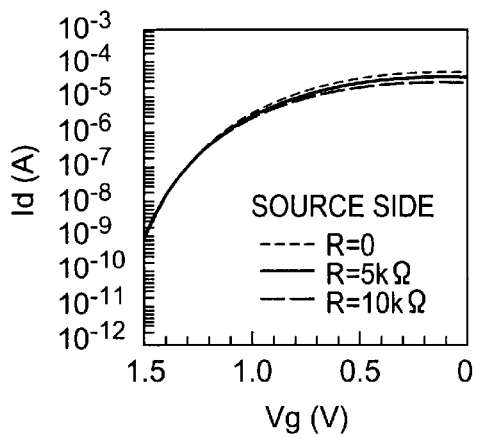
FIG. 2 is a diagram explaining how a current Id flowing through a third field effect transistor (PMOS 3) varies depending on a gate voltage Vg when a resistance element (resistor 5) connected between the third field effect transistor and a first bit line (BL1) has specific resistance values and FIGS. 2A, 2B each illustrate the voltage dependence (current-voltage (Id-Vg) characteristic) of current, in which the current Id is indicated on the axis of ordinates and the gate voltage Vg is indicated on the axis of abscissas, and the Id-Vg characteristic is represented on a logarithm scale in FIG. 2A and on a linear scale in FIG. 2B, and further.
FIG. 2C is a diagram of a circuit for measuring the Id-Vg characteristic.
Figure 2B:
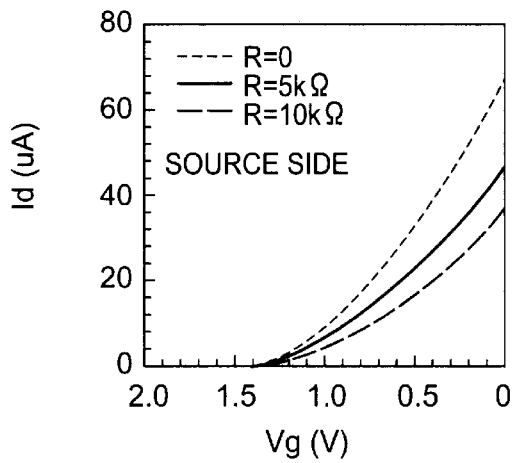
Figure 2C:
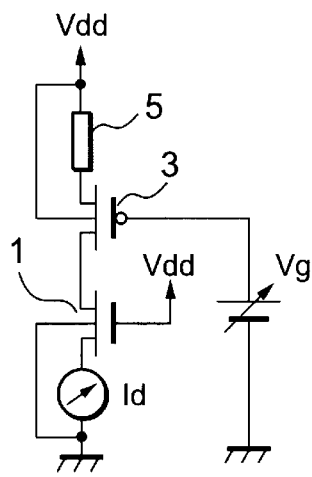
Figure 3:
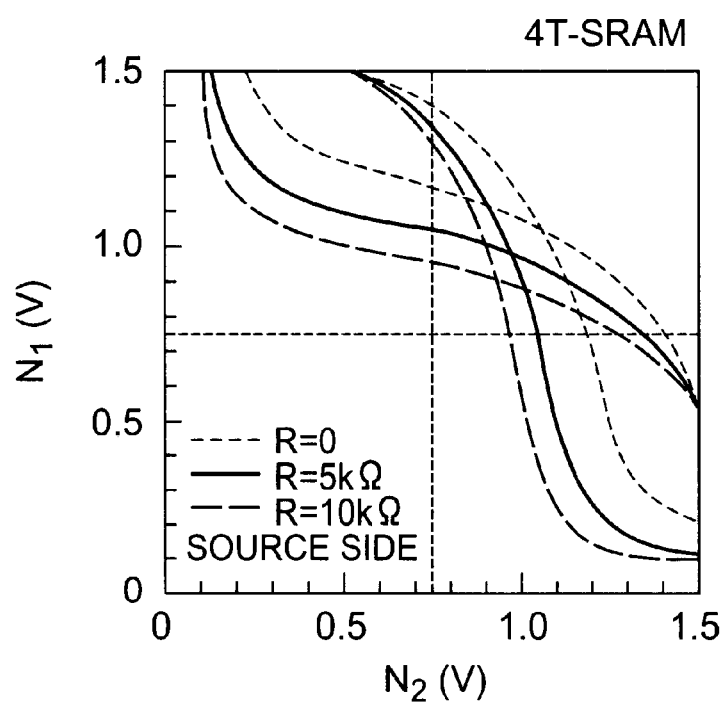
FIG. 3 is a graph illustrating the result obtained by simulating the SNM characteristic of a unit memory cell MCI using the Id-Vg characteristic shown in FIG. 2.

Subsequently, how the SNM of the unit memory cell MC1 constructed and improved as described above produces beneficial effects will be explained below. FIG. 2 is a diagram explaining how a current Id flowing through the PMOS 3 varies depending on a gate voltage Vg with respect to the values of the resistor 5 connected between the PMOS 3 and the first bit line BL1 and FIGS. 2A, 2B each illustrate the voltage dependence (current-voltage (Id-Vg) characteristic) of current, in which the current Id is indicated on the axis of ordinates and the gate voltage Vg is indicated on the axis of abscissas, and the Id-Vg characteristic is represented on a logarithm scale in FIG. 2A and on a linear scale in FIG. 2B, and further, FIG. 2C is a diagram of a circuit for measuring the Id-Vg characteristic. Note that the Id-Vg characteristic is measured under the conditions of Vdd=1.5 V. Furthermore, FIG. 3 is a-graph illustrating the result obtained by simulating the SNM characteristic of the unit memory cell MC1 using the Id-Vg characteristic shown in FIG. 2. As can be seen in the graph of FIG. 2, adding the resistor 5 makes it possible to lower the on-current $I_{onp3}$ of the PMOS 3 while keeping the off-current current $I_{offp3}$ thereof unchanged and further, improve the SNM of the unit memory cell MC1, as shown in FIG. 3. In the example, the SNM is improved such that the SNM becomes 380 mV when the resistance value of the resistor 5 (R 5) equals to 10 kilo-ohms in comparison with the fact that the SNM becomes 200 mV when the resistance value of the R 5 equals to zero.

Figure 4:
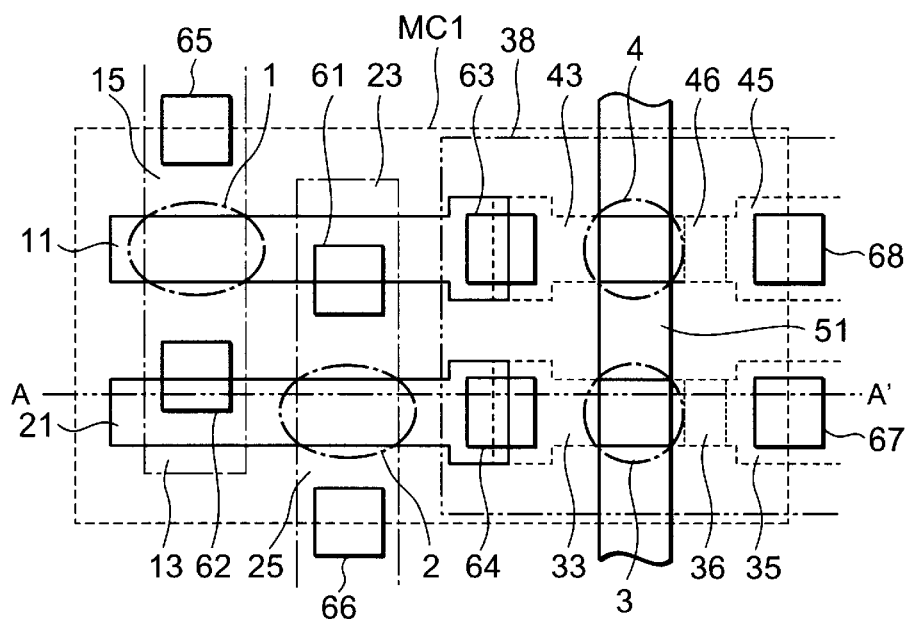
FIG. 4 is a schematic diagram of a first detailed example illustrating a positional relationship between a gate electrode, a diffusion region and a contact hole for providing interconnect between the gate electrode, the diffusion region and other components, those three components being formed in each Tr of the unit memory cell MCI shown in FIG. 1C.
Figure 5:
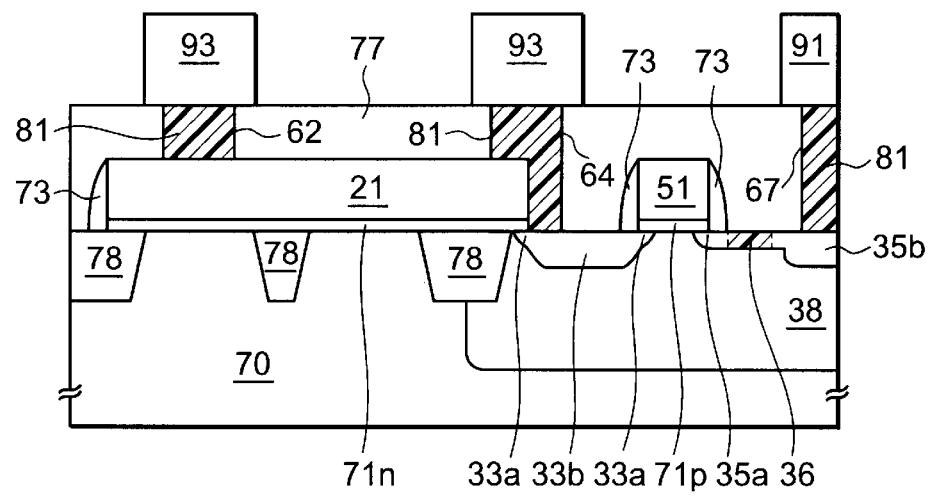
FIG. 5 is a schematic cross sectional view taken along line A–A' in FIG. 4 and having an upper metal wiring layer in addition to the cross section shown in FIG. 4.

Subsequently, an exemplified manufacturing method employed to prepare the first detailed example that has the resistors 5, 6 respectively inserted between the corresponding portions of the unit memory cell will be explained below. FIG. 4 is a schematic view of the first detailed example illustrating a positional relationship between a gate electrode, a diffusion region and a contact hole for providing interconnect between the gate electrode, the diffusion region and other components, those three components being formed in each Tr of the unit memory cell MC1 shown in FIG. 1C, and FIG. 5 is a schematic cross sectional view taken along line A–A' in FIG. 4 and having an upper metal wiring layer in addition to the cross section shown in FIG. 4. As can be seen from FIGS. 4, 5, the NMOSes 1, 2 are formed within a p-type region of a p-type substrate 70 in which semiconductor chips each containing the unit memory cell MC1 are formed and the PMOSes 3, 4 are formed within a n-type well 38 thereof. An n-type diffusion region 13 constituting one of electrodes of the NMOS 1 is connected to a gate electrode wiring 21 that is connected to a gate electrode of the NMOS 2 through a common contact hole 62 filled with tungsten 81, and an n-type diffusion region 15 constituting the other of the electrodes thereof is connected to the GND interconnect, not shown, formed of, for example, an aluminum (hereinafter, referred to as Al) wiring through a ground contact hole 65 filled with the tungsten 81, and further, a gate electrode of the NMOS 1 is connected to an n-type diffusion region 23 constituting one of electrodes of the NMOS 2 through the gate electrode wiring and a common contact hole 61 filled with the tungsten 81 and the gate electrode wiring 11. An n-type diffusion region 25 constituting the other of the electrodes of the NMOS 2 is connected to the GND interconnect, not shown, through a ground contact hole 66 filled with the tungsten 81. Furthermore, a p-type diffusion region 33 constituting one of electrodes of the PMOS 3 is connected to the gate electrode wiring 21 through a common contact hole 64 filled with the tungsten 81, and a p-type diffusion region 35 constituting the other of the electrodes thereof is connected to an Al wiring 91 constituting a first bit line BL1 through a bit contact hole 67 filled with the tungsten 81. Additionally, a p-type diffusion region 43 constituting one of electrodes of the PMOS 4 is connected to the gate electrode wiring 11 through a common contact hole 63 filled with the tungsten 81, and a p-type diffusion region 45 constituting the other of the electrodes thereof is connected to an Al wiring, not shown, constituting a second bit line /BL1 through a bit contact hole 68 filled with the tungsten 81, and in this case, both the gate electrodes of the PMOSes 3, 4 are connected to a gate electrode wiring 51. Moreover, the unit memory cell MC1 includes a p-type diffusion layer resistor region 36, which also serves as a resistor 5, formed between a connection portion of the p-type diffusion region 35, which portion is located between the p-type diffusion region 35 and the bit contact hole 67, and a gate portion of the PMOS 3, and similarly, includes a p-type diffusion layer resistor region 46, which also serves as a resistor 6, formed between a connection portion of the p-type diffusion region 45, which portion is located between the p-type diffusion region 45 and the bit contact hole 68, and a gate portion of the PMOS 4.

Figure 6A:
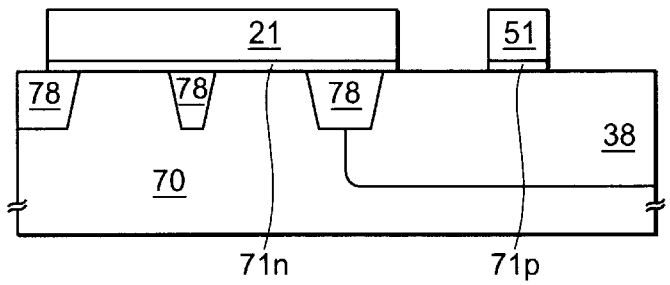
FIGS. 6A to 6D illustrate diagrams explaining the exemplified manufacturing method for forming the resistor elements (resistors 5, 6) within the corresponding p-type diffusion regions that respectively constitute the electrodes of the third and fourth field effect Trs (PMOSes 3, 4), and those diagrams are illustrated as cross sectional views of a semiconductor device including a unit memory cell in the order of primary steps of forming the semiconductor device, each view being taken along the line A–A' in FIG. 4.
Figure 6B:
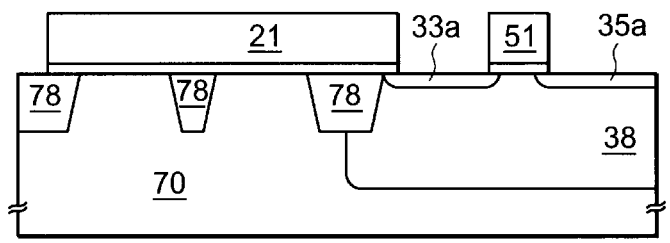
Figure 6C:
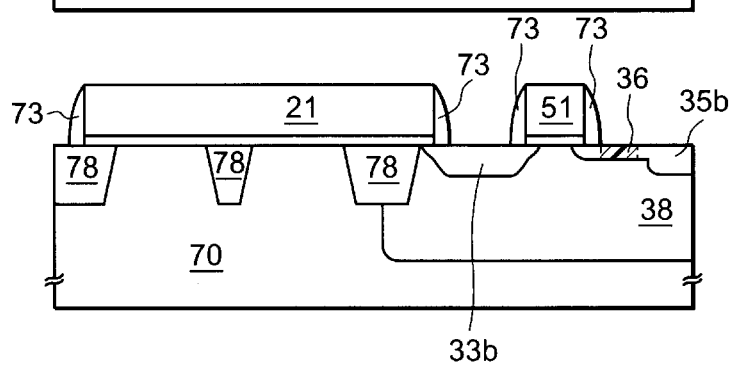
Figure 6D:
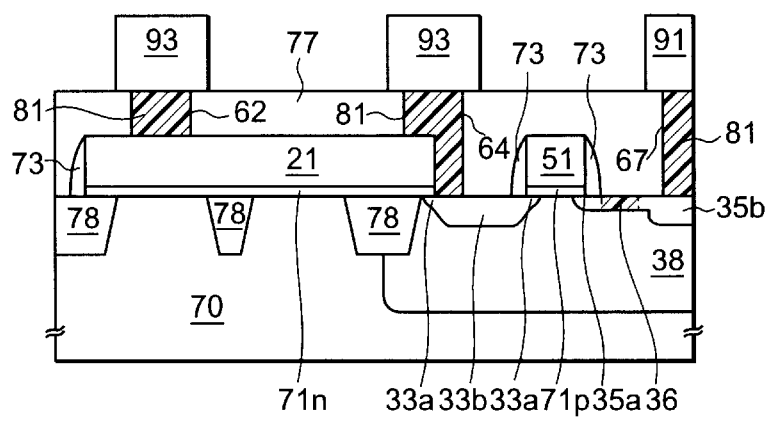

Subsequently, an exemplified manufacturing method for inserting the resistors 5, 6 respectively between the corresponding portions in accordance with the configuration of the first detailed example will be explained below. FIG. 6 illustrates diagrams explaining the exemplified manufacturing method for forming the resistors 5, 6 within the corresponding p-type diffusion regions that respectively constitute the electrodes of the PMOSes 3, 4, and those diagrams are illustrated as cross sectional views of a semiconductor device including the unit memory cell MCI in the order of primary steps of forming the semiconductor device, each view being taken along the line A–A' in FIG. 4. First, a field oxide film 78 is formed in a p-type substrate 70 and an n-type well 38 is formed therein, moreover, through the gate oxide film 71n, 71p, and then, gate electrodes and gate electrode wirings 11, 21, 51 made of a polycrystalline film are formed thereon (FIG. 6A). Subsequently, p–diffusion regions 33a, 35a and n–diffusion regions, not shown, are formed at predetermined positions by ion implantation (FIG. 6B). Note that the dopant to be implanted into the p–diffusion regions 33a, 35a and the concentration thereof may be appropriately determined based on the resistance value of the resistors 5, 6 constituted by the p-type diffusion layer resistor regions 36, 46. For example, when boron B is implanted to a concentration from about 1013 atms/cm$^2$ to 1014 atms/cm$^2$, a resistor is formed to have a sheet resistance in the range of several hundred ohms/square to several kilo-ohms/square and a resistance value of several hundred ohms to several kilo-ohms can easily be achieved. Then, a sidewall oxide film 73 is formed in NMOS regions, not shown, as well as the unit memory cell MC1, and p+diffusion regions 33b, 35b and n+regions, not shown, are formed at predetermined positions by ion implantation. In this case, the p-type diffusion layer resistor region 36 constituting the resistor 5 and the p-type diffusion layer resistor region 46, not shown, constituting the resistor 6 each are protected by a photoresist (hereinafter, referred to as PR) mask (FIG. 6C). Thereafter, an interlayer insulation film 77 made of a silicon oxide film, a silicon nitride film or a laminated film consisting of those two films is deposited thereon, and common contact holes 61 to 64, ground contact holes 65, 66 and bit contact holes 67, 68 along with other contact holes, not shown, are formed in the interlayer insulation film 77, and then, tungsten 81 is formed within each of those contact holes. Furthermore, an Al film is deposited thereon, and patterned to define an Al wiring 91 including a desired Al wiring such as a GND wiring, not shown, and an Al cap 93 (FIG. 6D). Note that in the example, the Al cap 93 is formed only to cover an upper portion of each of the common contact holes 62, 64 and not connected to other interconnect wirings and elements, and therefore, the semiconductor device of the first detailed example need not include the Al cap 93. Although multi-layer interconnects as the second or higher interconnect layer are formed as needed in the subsequent process steps, those steps do not directly affect the critical configuration of the present invention, meaning that the present invention may optionally employ a known manufacturing method for forming multi-layer interconnects as the second or higher interconnect layer when needed, and therefore, explanation of those steps is omitted in the following description.

As described above, in the first detailed example, the resistors 5, 6 are formed in such a simple manner that the concentration of the dopant within the p–diffusion regions 33a, 35a is appropriately adjusted and the p-type diffusion layer resistor regions 36, 46 are easily protected by a PR mask when ion implantation is performed to form the p+diffusion regions 33b, 35b, thereby eliminating increase in an area occupied by the unit memory cell and the need for extraordinary manufacturing steps.

Figure 7A:
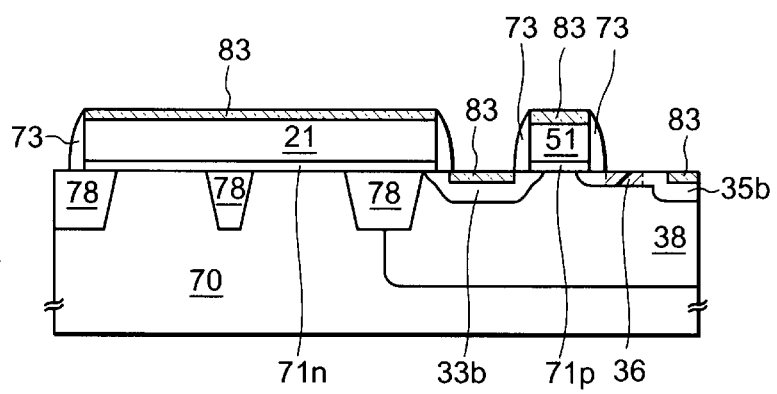
FIGS. 7A, 7B illustrate cross sectional views of a semiconductor device in the order of primary steps of forming the silicide layer, each view being taken along the line A–A'.
Figure 7B:
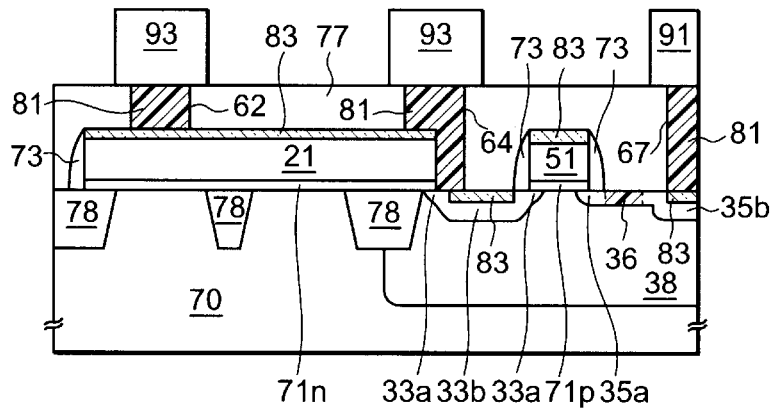

Moreover, the semiconductor device of the present invention may be constructed such that after the p+diffusion regions 33b, 35b and the n+diffusion regions, not shown, are formed at the predetermined positions by ion implantation while the p-type diffusion layer resistor region 36 constituting the above-described resistor 5 and the p-type diffusion layer resistor region 46, not shown, constituting the above-described resistor 6 are protected by a PR mask (FIG. 6C), a silicide layer is formed on the surface of the gate electrode wirings 11, 21, 51, the p+diffusion regions 33b, 35b and the n+diffusion regions, not shown. Even in this case, a positional relationship between a gate electrode, a diffusion region and a contact hole for providing interconnect between the gate electrode, the diffusion region and other components, those three components being formed in each Tr of the unit memory cell MC1, is the same as that shown in the schematic diagram of FIG. 4, and FIG. 7 illustrates cross sectional views of a semiconductor device in the order of primary steps of forming the silicide layer, each view being taken along the line A–A'. After completion of processing explained in the description of the steps up to the step shown in FIG. 6C, the insulation films (normally a silicon oxide film) existing on the diffusion regions and the gate wirings are removed while predetermined regions including the p-type diffusion layer resistor regions 36, 46 are protected by a PR mask, and then, the PR mask is removed. Then, for example, a refractory metal such as cobalt is deposited to a specific film thickness and heated to form a silicide layer 83. Thereafter, an unnecessary refractory metal remaining on the insulation film and the like is removed (FIG. 7A). Subsequently, an interlayer insulation film 77 is deposited, and common contact holes 61 to 64, ground contact holes 65, 66 and bit contact holes 67, 68 along with other contact holes, not shown, are formed in the interlayer insulation film 77, and then, tungsten 81 is formed within each of those contact holes. Furthermore, an Al film is deposited thereon, and patterned to define an Al wiring 91 including a desired interconnect wiring such as a GND wiring, not shown, and an Al cap 93 (FIG. 7B). Note that also in the example, the Al cap 93 is formed only to cover an upper portion of each of the common contact holes 62, 64 and not connected to other interconnect wirings and elements, and therefore, the unit memory cell MC1 need not include the Al cap 93. After that, the semiconductor device of the example may have multi-layer interconnects as the second or higher interconnect layer formed as needed in the subsequent process steps, as is the case with the previous example, and therefore, explanation of those steps is omitted in the following description. As described above, the silicide layer 83 is formed on the surface of the diffusion regions other than the p-type diffusion layer resistor regions 36, 46 and on the surface of the interconnect wirings such as a gate electrode wiring made of a polysilicon film, thereby allowing a semiconductor device to reduce interconnect resistances and operate at a higher rate.

Figure 8:
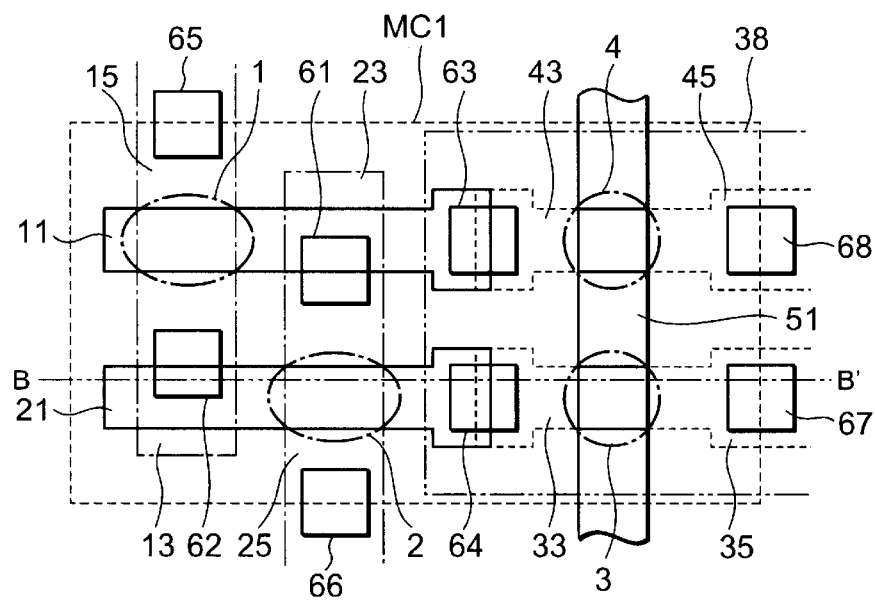
FIG. 8 is a schematic view of a second detailed example illustrating a positional relationship between a gate electrode, a diffusion region and a contact hole for providing interconnect between the gate electrode, the diffusion region and other components, those three components being formed in each Tr of the unit memory cell shown in FIG. 1C.
Figure 9:
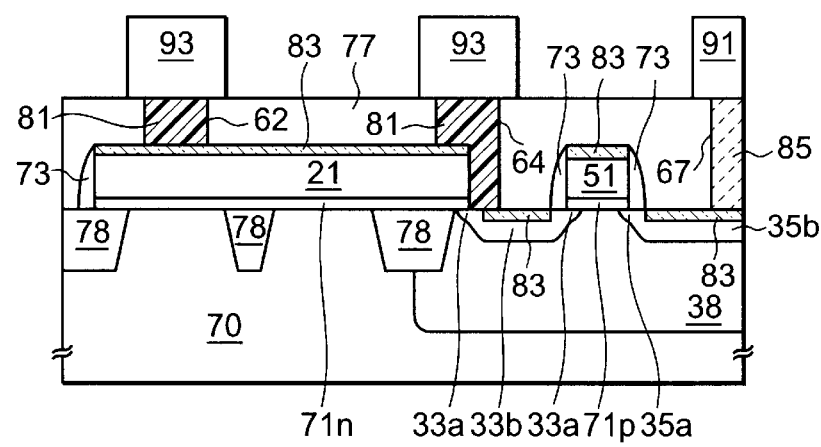
FIG. 9 is a schematic cross sectional view taken along line B–B' in FIG. 8 and having an upper metal wiring layer in addition to the cross section shown in FIG. 8.

Subsequently, a second detailed example in which the resistors 5, 6 are respectively inserted between associated portions of a unit memory cell will be explained below. As is already explained in the description of the schematic diagram shown in FIG. 4, FIG. 8 is a schematic diagram of the second detailed example illustrating a positional relationship between a gate electrode, a diffusion region and a contact hole for providing interconnect between the gate electrode, the diffusion region and other components, those three components being formed in each Tr of the unit memory cell MC1 shown in FIG. 1C, and FIG. 9 is a schematic cross sectional view taken along line B–B' in FIG. 8 and having an upper metal wiring in addition to the cross section shown in FIG. 8. As can be seen from FIGS. 8, 9, the NMOSes 1, 2 are formed within a p-type region of a p-type substrate 70 in which semiconductor chips each containing the unit memory cell MC1 are formed and the PMOSes 3, 4 are formed within a n-type well 38 thereof. An n-type diffusion region 13 constituting one of electrodes of the NMOS 1 is connected to a gate electrode wiring 21 that is connected to a gate electrode of the NMOS 2 through a common contact hole 62 filled with tungsten 81, and an n-type diffusion region 15 constituting the other of the electrodes thereof is connected to a GND wiring, not shown, formed of, for example, an aluminum wiring through a ground contact hole 65 filled with the tungsten 81, and further, a gate electrode of the NMOS 1 is connected to an n-type diffusion region 23 constituting one of electrodes of the NMOS 2 through the gate electrode wiring 11 and a common contact hole 61 filled with the tungsten 81. An n-type diffusion region 25 constituting the other of the electrodes of the NMOS 2 is connected to the GND wiring, not shown, through a ground contact hole 66 filled with the tungsten 81. Furthermore, a p-type diffusion region 33 constituting one of electrodes of the PMOS 3 is connected to the gate electrode wiring 21 through a common contact hole 64 filled with the tungsten 81, and a p-type diffusion region 35 constituting the other of the electrodes thereof is connected to an Al wiring 91 constituting a first bit line BL1 through a bit contact hole 67 filled with polysilicon 85. Additionally, a p-type diffusion region 43 constituting one of electrodes of the PMOS 4 is connected to the gate electrode wiring 11 through a common contact hole 63 filled with the tungsten 81, and a p-type diffusion region 45 constituting the other of the electrodes thereof is connected to an Al wiring, not shown, constituting a second bit line /BL1 through a bit contact hole 68 filled with the polysilicon 85, and further, both the gate electrodes of the PMOSes 3, 4 are connected to a gate electrode wiring 51. In this case, the bit contact holes 67, 68, both being filled with the polysilicon 85, serve respectively as resistors 5, 6. Note that although the example in which a silicide layer 83 is formed on the predetermined surface of the diffusion regions and the gate electrode wirings is explained, the example may not include the silicide layer 83.

Figure 10A:
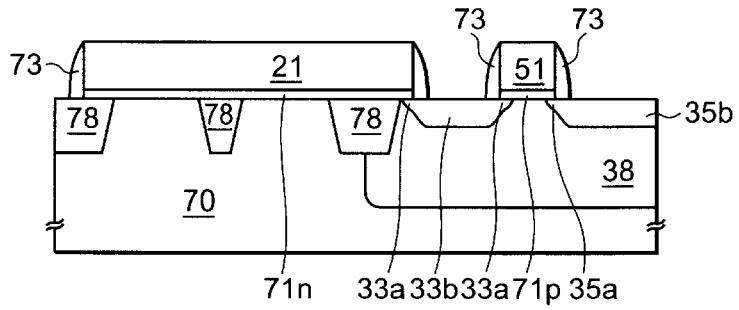
FIGS. 10A to 10D illustrate diagrams explaining the exemplified manufacturing method for forming the resistance elements within the bit contact holes and the diagrams are illustrates as cross sectional views of a semiconductor device including the unit memory cell in the order of primary steps of forming the semiconductor device, each view being taken along the line B–B' in FIG. 8.
Figure 10B:
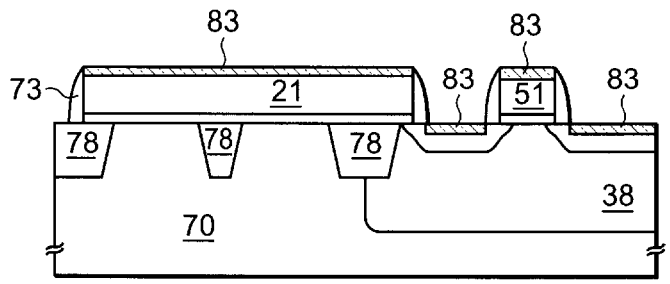
Figure 10C:
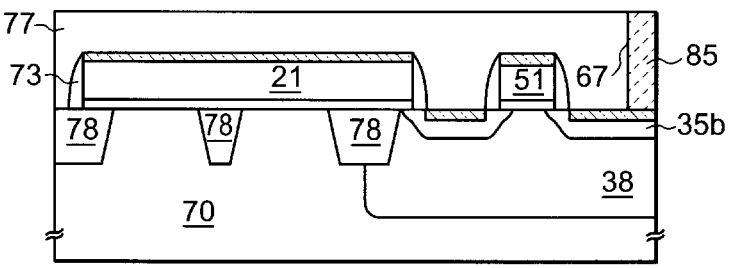
Figure 10D:
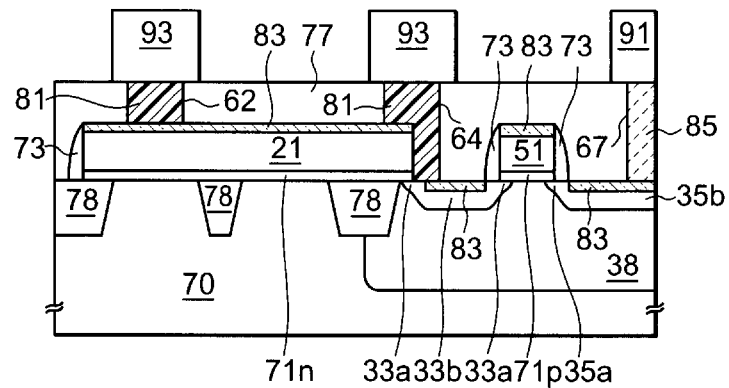

Subsequently, an exemplified manufacturing method employed to prepare the second detailed example that has the resistors 5, 6 respectively inserted between the corresponding portions of the unit memory cell will be explained below. FIG. 10 illustrates diagrams explaining the exemplified manufacturing method for forming the resistors 5, 6 within the bit contact holes 67, 68 and the diagrams are illustrated as cross sectional views of a semiconductor device including the unit memory cell MCl in the order of primary steps of forming the semiconductor device, each view being taken along the line B–B' in FIG. 8. Note that the second detailed example also employs the same process steps as those employed in the first detailed example up to the step, shown in FIG. 6B, of forming the p–diffusion regions 33a, 35a and the n–diffusion regions, not shown, at the predetermined positions by using ion implantation, and therefore, the corresponding figures are not shown again. Then, a sidewall oxide film 73 is formed in NMOS regions, not shown, as well as the unit memory cell MC1, and p+diffusion regions 33b, 35b and n+regions, not shown, are formed at predetermined positions by ion implantation (FIG. 10A). Thereafter, the insulation films (normally a silicon oxide film) existing on the diffusion regions and the gate wirings are removed and, for example, a refractory metal such as cobalt is deposited to a specific film thickness and heated to form a silicide layer 83. Subsequently, an unnecessary refractory metal remaining on the insulation film and the like is removed (FIG. 10B). After that, an interlayer insulation film 77 made of a silicon oxide film, a silicon nitride film or a laminated film of those two films is deposited, and bit contact holes 67, 68 are formed therein. Then, polysilicon 85 containing specific dopants that have a predetermined concentration is formed within the bit contact holes 67, 68 to thereby form resistors having a desired resistance value (FIG. 10C). Subsequently, common contact holes 61 to 64 and ground contact holes 65, 66 are formed in the interlayer insulation film 77 and those contact holes are filled with tungsten 81, and an Al film is deposited thereon, and patterned to define an Al wiring 91 including a desired interconnect wiring such as a GND wiring, not shown, and an Al cap 93 (FIG. 10D). Note that also in the example, the Al cap 93 is formed only to cover an upper portion of each of the common contact holes 62, 64 and not connected to other interconnect wirings and elements, and therefore, the semiconductor device of the second detailed example need not include the Al cap 93. After that, the semiconductor device of the second detailed example may have multi-layer interconnects as the second or higher interconnect layer formed as needed in the subsequent process steps, as is the case with the first detailed example, and therefore, explanation of those steps is omitted in the following description.

As described above, the number of process steps of forming the semiconductor device of the second detailed example increases a little bit since the steps of forming the bit contact holes 67, 68 and filling those holes with the associated material are required in addition to the steps of forming the common contact holes and the ground contact holes positioned at locations different from those of the bit contact holes 67, 68. However, since the resistors 5, 6 can be formed by filling the bit contact holes 67, 68 with polysilicon containing appropriate dopants that have a preferable concentration, the semiconductor device of the second detailed example is free from increase in an area occupied by the unit memory cell.

Figure 11A:
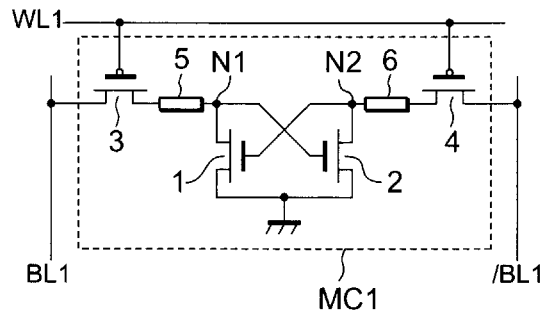
FIG. 11 is a diagram illustrating an example of the modified configuration of the embodiment of the present invention and FIGS. 11A, 11B, 11C respectively are a circuit diagram illustrating the modified configuration of unit memory cell, a schematic diagram illustrating a positional relationship between a gate electrode, a diffusion region and a contact hole for providing interconnect between the gate electrode, the diffusion region and other components, those three components being formed in each Tr in the modified configuration of unit memory cell, and a schematic cross sectional view taken along line C–C' in FIG. 11B and having an upper metal interconnect layer in addition to the cross section shown in FIG. 11B.
Figure 11B:
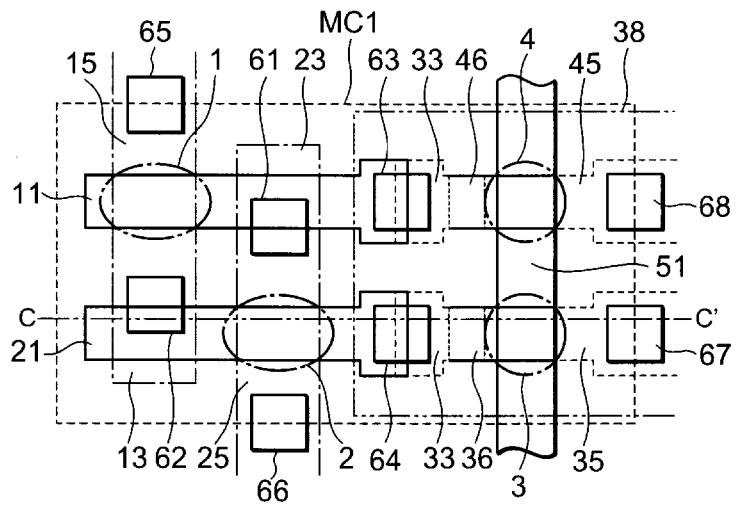
Figure 11C:
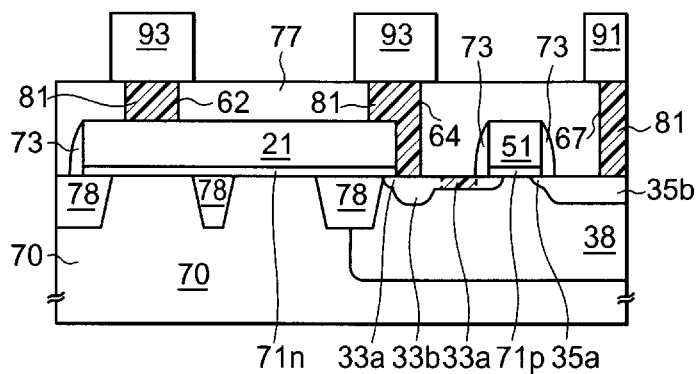
Figure 12:
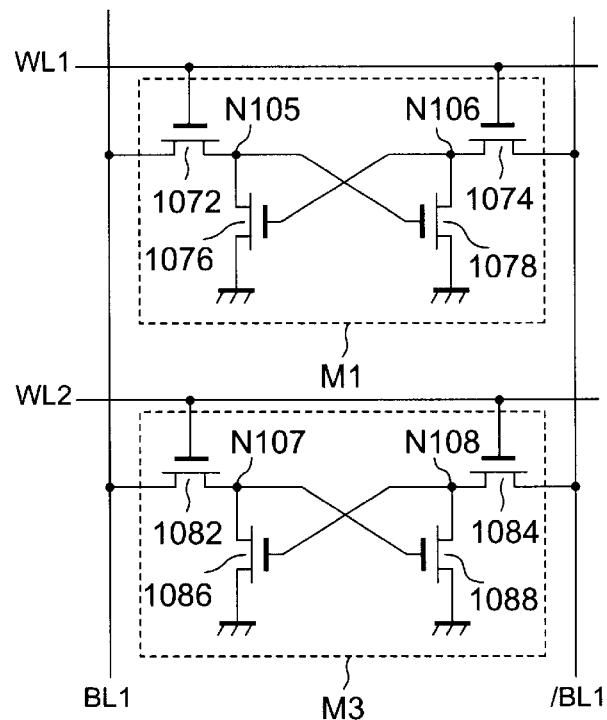
FIG. 12 is a circuit diagram illustrating the configurations of a memory cell M1 and a memory cell M3 of a semiconductor memory device disclosed in Japanese Patent Application Laid-open No. 13(2001)-167573.
Figure 13:
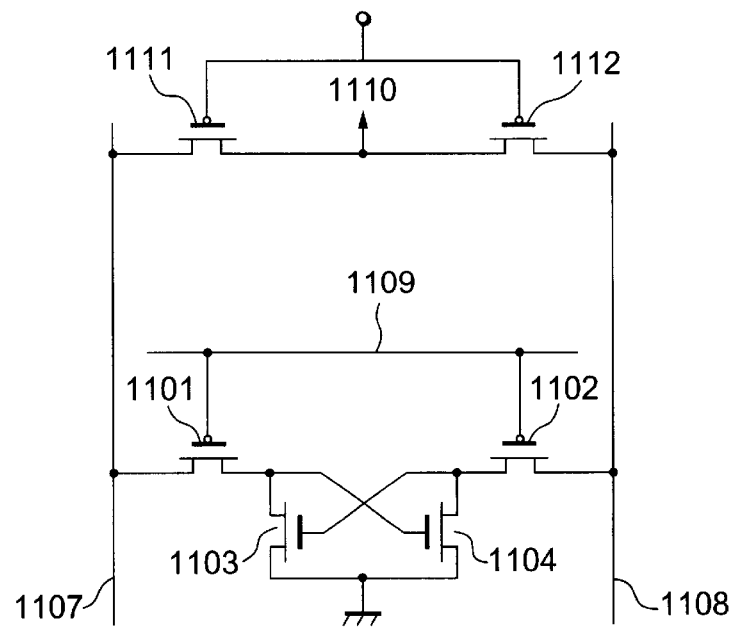
FIG. 13 is a circuit diagram illustrating the configurations of an SRAM memory cell disclosed in Japanese Patent Application Laid-open No. 7(1995)-302847.
Figure 14:
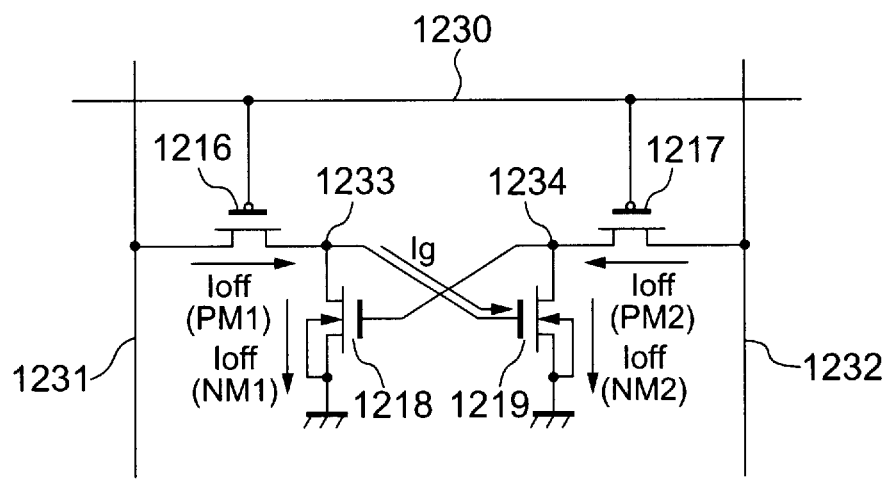
FIG. 14 is a circuit diagram illustrating the configurations of a unit memory cell of a semiconductor memory device disclosed in Japanese Patent Application Laid-open No. 12(2000)-124333.
Figure 15A:
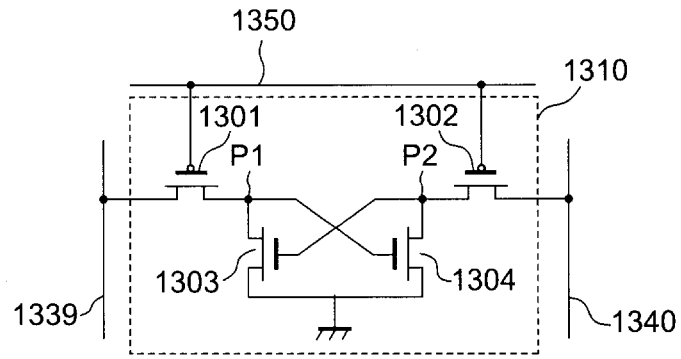
FIGS. 15A to 15C are diagrams to explain what the SNM is.
Figure 15B:
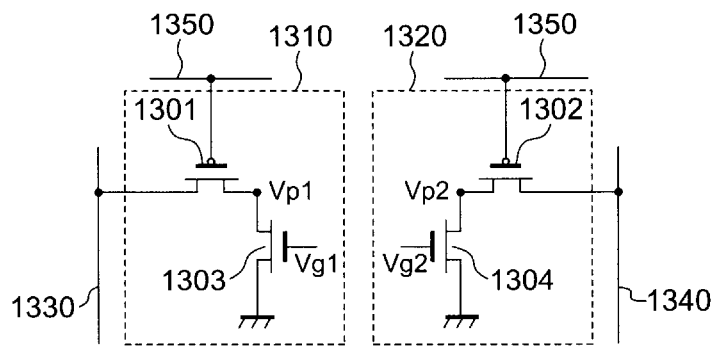
Figure 15C:
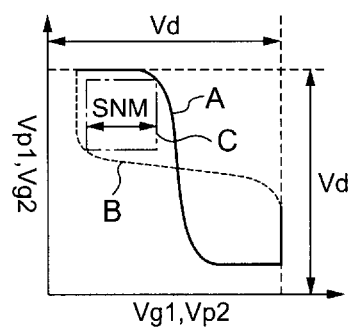

It should be noted that although the present invention is explained in the description of the embodiment and examples, the present invention is not limited to those embodiment and examples and therefore, various modifications and improvements made to and in the above-described embodiment and examples without departing from the spirit and scope of the objects of the present invention may be included in the present invention. For instance, although the configuration of unit memory cell in which the first resistance element inserted between the third field effect Tr and the first bit line, and the second resistance element inserted between the fourth field effect Tr and the second bit line is explained in the example of the present invention, the modified configuration in which the first resistance element inserted between the third field effect Tr and the first node, and the second resistance element inserted between the fourth field effect Tr and the second node may also be employed in the example of the present invention. FIG. 11 is a diagram illustrating an example of the modified configuration and FIGS. 11A, 11B, 11C respectively are a circuit diagram illustrating the modified configuration of unit memory cell MC1, a schematic diagram illustrating a positional relationship between a gate electrode, a diffusion region and a contact hole for providing interconnect between the gate electrode, the diffusion region and other components, those three components being formed in each Tr in the modified configuration of unit memory cell MC1, and a schematic cross sectional view taken along line C–C' in FIG. 11B and having an upper metal interconnect layer in addition to the cross section shown in FIG. 11B. Note that FIGS. 11A, 11B, 11C correspond respectively to FIGS. 1C, 4, 5 used in the description of the above-described embodiment, and the parts and components used in the modified configuration and having the same function as those used in the embodiment are denoted by the same numerals as those referred in the embodiment. The modified configuration is different from the first detailed example of the above-described embodiment only in that the p-type diffusion layer resistor region 36 constituting the resistor 5 as the first resistance element and the p-type diffusion layer resistor region 46 constituting the resistor 6 as the second resistance element, both resistor regions being included in the modified configuration, are formed respectively in the p-type diffusion regions 33, 43, and all the process steps of forming the invented semiconductor device are common to the modified configuration and the first detailed example, and therefore, the detailed description thereof is omitted for simplicity.

Moreover, in the above-described embodiment, although the unit memory cell is constructed such that the first and second field effect Trs are formed of an NMOS and the third and fourth field effect Trs are formed of a PMOS, when at least the situation where the first and second field effect Trs are formed of the same conduction Tr and the third and fourth field effect Trs are formed of the same conduction Tr is maintained, the unit memory cell may also be constructed by applying any combination of the first, second, third, fourth Trs to a unit memory cell. Furthermore, regarding the third and fourth field effect Trs, a low concentration diffusion region having a predetermined area and not covered by the sidewall oxide film of the gate electrode is provided in at least one of diffusion regions as an electrode of Tr, allowing the unit memory cell to have the diffusion layer resistor region formed therein.

Additionally, a metal wiring may be realized by employing an Al—Cu wiring or an Al—Si—Cu wiring which is formed by adding copper (Cu) or silicon (Si) to Al, or a Cu wiring or the like, instead of the above-described Al wiring. Moreover, instead of tungsten used to fill each contact hole, other refractory metals or refractory metal silicides, or further, Al or Cu may be employed.

Furthermore, alternatively, the first and second resistance elements may be formed by a method constructed by combining the methods employed in the first and second detailed examples of the above-described embodiment.

As described so far, the unit memory cell comprised of a load less 4-Tr cell and included in the semiconductor device of the present invention is constructed such that the first resistance element and the source/drain path of the third field effect Tr are connected in series between the first node and the first bit line, and the second resistance element and the source/drain path of the fourth field effect Tr are connected in series between the second node and the second bit line. This construction of unit memory cell improves the SNM while maintaining the retention characteristic of unit memory cell and allows a memory cell array to operate at a further lower voltage. Moreover, in particular, the process steps of forming the first resistance element as a low concentration diffusion region within the diffusion region that constitutes one of the electrodes of the third field effect Tr and forming the second resistance element as a low concentration diffusion region within the diffusion region that constitutes one of the electrodes of the fourth field effect Tr make it possible to realize the above-described construction of unit memory cell while preventing increase in an area occupied by a unit memory cell and eliminating the need for extraordinary manufacturing steps.

What is claimed is:

1. A semiconductor device comprising a memory cell array having a plurality of unit memory cells disposed in a row and column array,
    said unit memory cell including:
        first and second field effect transistors of a first conduction type;
        third and fourth field effect transistors of a second conduction type; and
        first and second resistance elements,
        said unit memory cell being constructed such that a source/drain path of said first field effect transistor is connected between a first power supply and a first node, a source/drain path of said second field effect transistor is connected between said first power supply and a second node, a gate electrode of said first field effect transistor is connected to said second node, a gate electrode of said second field effect transistor is connected to said first node, a series-connected structure constructed by connecting a source/drain path of said third field effect transistor and said first resistance element in series is connected between said first node and a first bit line, a series-connected structure constructed by connecting a source/drain path of said fourth field effect transistor and said second resistance element in series is connected between said second node and a second bit line paired with said first bit line, and both gate electrodes of said third and fourth field effect transistors are connected to a word line, wherein said third and fourth field effect transistors being made to operate as a selection transistor during turn-on state and further being made to operate as a pull-up element during standby time, thereby constituting a load less four transistor cell.

2. The semiconductor device according to claim 1, wherein said first conduction type and said second conduction type are opposite one another.

3. The semiconductor device according to claim 1, wherein each of said first and second field effect transistors is an n-type field effect transistor, each of said third and fourth field effect transistors is a p-type field effect transistor, and said first power supply is a lower power supply.

4. The semiconductor device according to claim 1, wherein said first conduction type and said second conduction type are the same.

5. The semiconductor device according to claim 4, wherein each of said first to fourth field effect transistors is an n-type field effect transistor and said first power supply is a lower power supply.

6. The semiconductor device according to claim 4, wherein said first resistance element is connected between said third field effect transistor and said first node, and said second resistance element is connected between said fourth field effect transistor and said second node.

7. A semiconductor device comprising a memory cell array having a plurality of unit memory cells disposed in a row and column array,
    said unit memory cell including:
        first and second field effect transistors of a first conduction type;
        third and fourth field effect transistors of a second conduction type; and
        first and second resistance elements,
        said unit memory cell being constructed such that a source/drain path of said first field effect transistor is connected between a first power supply and a first node, a source/drain path of said second field effect transistor is connected between said first power supply and a second node, a gate electrode of said first field effect transistor is connected to said second node, a gate electrode of said second field effect transistor is connected to said first node, a series-connected structure constructed by connecting a source/drain path of said third field effect transistor and said first resistance element in series is connected between said first node and a first bit line, a series-connected structure constructed by connecting a source/drain path of said fourth field effect transistor and said second resistance element in series is connected between said second node and a second bit line paired with said first bit line, and both gate electrodes of said third and fourth field effect transistors are connected to a word line, thereby constituting a load less four transistor cell,
    wherein said first resistance element is formed within a diffusion region constituting an electrode of said third field effect transistor and said second resistance element is formed within a diffusion region constituting an electrode of said fourth field effect transistor.

8. The semiconductor device according to claim 7, wherein both said first resistance element and said second resistance element consist of a low concentration diffusion region.

9. A semiconductor device comprising a memory cell array having a plurality of unit memory cells disposed in a row and column array,
   said unit memory cell including:
      first and second field effect transistors of a first conduction type;
      third and fourth field effect transistors of a second conduction type; and
      first and second resistance elements,
      said unit memory cell being constructed such that a source/drain path of said first field effect transistor is connected between a first power supply and a first node, a source/drain path of said second field effect transistor is connected between said first power supply and a second node, a gate electrode of said first field effect transistor is connected to said second node, a gate electrode of said second field effect transistor is connected to said first node, a series-connected structure constructed by connecting a source/drain path of said third field effect transistor and said first resistance element in series is connected between said first node and a first bit line, a series-connected structure constructed by connecting a source/drain path of said fourth field effect transistor and said second resistance element in series is connected between said second node and a second bit line paired with said first bit line, and both gate electrodes of said third and fourth field effect transistors are connected to a word line, thereby constituting a load less four transistor cell,
      wherein said first conduction type and said second conduction type are opposite one another; and
      wherein said first resistance element is connected between said third field effect transistor and said first bit line, and said second resistance element is connected between said fourth field effect transistor and said second bit line.

10. A semiconductor device comprising a memory cell array having a plurality of unit memory cells disposed in a row and column array,
    said unit memory cell including:
       first and second field effect transistors of a first conduction type;
       third and fourth field effect transistors of a second conduction type; and
       first and second resistance elements,
       said unit memory cell being constructed such that a source/drain path of said first field effect transistor is connected between a first power supply and a first node, a source/drain path of said second field effect transistor is connected between said first power supply and a second node, a gate electrode of said first field effect transistor is connected to said second node, a gate electrode of said second field effect transistor is connected to said first node, a series-connected structure constructed by connecting a source/drain path of said third field effect transistor and said first resistance element in series is connected between said first node and a first bit line, a series-connected structure constructed by connecting a source/drain path of said fourth field effect transistor and said second resistance element in series is connected between said second node and a second bit line paired with said first bit line, and both gate electrodes of said third and fourth field effect transistors are connected to a word line, thereby constituting a load less four transistor cell,
       wherein said first conduction type and said second conduction type are opposite one another; and
       wherein said first resistance element is formed within a contact hole located in a path connecting said third field effect transistor and said first bit line to each other and connected to said first bit line, and said second resistance element is formed within a contact hole located in a path connecting said fourth field effect transistor and said second bit line to each other and connected to said second bit line.

11. A semiconductor device comprising a memory cell array having a plurality of unit memory cells disposed in a row and column array,
    said unit memory cell including:
       first and second field effect transistors of a first conduction type;
       third and fourth field effect transistors of a second conduction type; and
       first and second resistance elements,
       said unit memory cell being constructed such that a source/drain path of said first field effect transistor is connected between a first power supply and a first node, a source/drain path of said second field effect transistor is connected between said first power supply and a second node, a gate electrode of said first field effect transistor is connected to said second node, a gate electrode of said second field effect transistor is connected to said first node, a series-connected structure constructed by connecting a source/drain path of said third field effect transistor and said first resistance element in series is connected between said first node and a first bit line, a series-connected structure constructed by connecting a source/drain path of said fourth field effect transistor and said second resistance element in series is connected between said second node and a second bit line paired with said first bit line, and both gate electrodes of said third and fourth field effect transistors are connected to a word line, thereby constituting a load less four transistor cell,
       wherein each of said first and second field effect transistors is an n-type field effect transistor, each of said third and fourth field effect transistors is a p-type field effect transistor, and said first power supply is a lower power supply; and
       wherein said first resistance element is connected between said third field effect transistor and said first bit line, and said second resistance element is connected between said fourth field effect transistor and said second bit line.

12. A semiconductor device comprising a memory cell array having a plurality of unit memory cells disposed in a row and column array,
    said unit memory cell including:
       first and second field effect transistors of a first conduction type;
       third and fourth field effect transistors of a second conduction type; and
       first and second resistance elements,
       said unit memory cell being constructed such that a source/drain path of said first field effect transistor is connected between a first power supply and a first node, a source/drain path of said second field effect transistor is connected between said first power supply and a second node, a gate electrode of said first field effect transistor is connected to said second node, a gate electrode of said second field effect transistor is connected to said first node, a series-connected structure constructed by connecting a source/drain path of said third field effect transistor and said first resistance element in series is connected between said first node and a first bit line, a series-connected structure constructed by connecting a source/drain path of said fourth field effect transistor and said second resistance element in series is connected between said second node and a second bit line paired with said first bit line, and both gate electrodes of said third and fourth field effect transistors are connected to a word line, thereby constituting a load less four transistor cell, wherein each of said first and second field effect transistors is an n-type field effect transistor, each of said third and fourth field effect transistors is a p-type field effect transistor, and said first power supply is a lower power supply; and wherein said first resistance element is formed within a contact hole located in a path connecting said third field effect transistor and said first bit line to each other and connected to said first bit line, and said second resistance element is formed within a contact hole located in a path connecting said fourth field effect transistor and said second bit line to each other and connected to said second bit line.

* * * * *